United States Patent [19]

Nakada

[11] Patent Number: 5,488,297
[45] Date of Patent: Jan. 30, 1996

[54] THREE DIMENSIONAL ANISOTROPY CONTRAST MAGNETIC RESONANCE IMAGING

[75] Inventor: Tsutomu Nakada, San Francisco, Calif.

[73] Assignee: The Regents of the University of California, Oakland, Calif.

[21] Appl. No.: 277,670

[22] Filed: Jul. 19, 1994

[51] Int. Cl.[6] .................................................. G01V 3/14
[52] U.S. Cl. .......................................... 324/309; 324/307
[58] Field of Search ..................................... 324/300, 306, 324/307, 304, 312; 364/413.22

[56] References Cited

U.S. PATENT DOCUMENTS

| | | |
|---|---|---|
| 4,609,872 | 9/1986 | O'Donnel ............................ 324/309 X |
| 4,690,150 | 9/1987 | Mayo, Jr. . |
| 4,697,594 | 10/1987 | Mayo, Jr. . |
| 4,698,593 | 10/1987 | Crooks . |
| 4,719,423 | 1/1988 | Vinegar et al. . |
| 4,728,892 | 3/1988 | Vinegar et al. . |
| 4,789,831 | 12/1988 | Mayo, Jr. . |
| 4,913,159 | 4/1990 | Gardin et al. . |
| 4,945,478 | 7/1990 | Merickel et al. . |
| 5,003,979 | 4/1991 | Merickel et al. . |
| 5,092,335 | 3/1992 | Le Bihan . |
| 5,151,856 | 9/1992 | Halmann et al. . |
| 5,200,345 | 4/1993 | Young . |
| 5,211,169 | 5/1993 | Freeland . |
| 5,216,602 | 6/1993 | Wolfkiel et al. . |
| 5,235,279 | 8/1993 | Kaufman et al. . |

OTHER PUBLICATIONS

Hajnal et al. (1991) JMRI 1(2):209 Abstract #331.
Moseley et al. (1990) Radiology 176:439–445.
Le Bihan et al. (1993) NeuroReport 4:887–890.
Stejskal (1965) J. Chem. Phys. 43(10):3597–3603.
Stejskal et al. (1964) Dept. Chem., Univ. WI, pp. 288–292 "Spin Diffusion Meas.: Spin Echoes in Presence . . . Gradient".
Le Bihan et al. (1986) Radiology 161(2): 401–407.
Moseley et al. (1990) Magnetic Resonance Med. 14:330–346.
Chenevert et al. (1990) Radiology 177(2):401–405.

Primary Examiner—Sandra L. O'Shea
Assistant Examiner—Mack Haynes
Attorney, Agent, or Firm—John P. O'Banion

[57] ABSTRACT

A method for contrast magnetic resonance imaging (MRI) based on three axial anisotropic diffusion weighted images (DWIs) of the identical imaging plane. Three primary colors, red, green, and blue, are first assigned to the gray scale of the three axial, x-, y-, z-axis, anisotropic DWIs. These three primary color images are then vectorially combined to form a single image in full visible color spectrum. Since the sum of the three primary colors of the same intensity results in cancellation (white out), the process effectively eliminates the background signals from isotropic water motion. Accordingly, each pixel of the final color image exhibits a color of a unique frequency, according to the balance of red, green, and blue, reflecting direction of anisotropic water motion in space. Water motion in neuronal fibers, especially those in axons, possesses high intravoxel anisotropy compared to other elements of the nervous system. Therefore, the method is especially sensitive for discerning axonal direction and density.

29 Claims, 2 Drawing Sheets

THREE DIMENSIONAL ANISOTROPY CONTRAST MAGNETIC RESONANCE IMAGING

BACKGROUND OF THE INVENTION

This invention was made with Government support under Grant No. GM 37197 awarded by the National Institutes of Health. The Government has certain rights in this invention.

1. Field of the Invention

This invention pertains generally to obtaining a visual image of an object using magnetic resonance imaging, and more particularly to a method for constructing, from axial anisotropic diffusion weighted images of the same imaging slice, a color image in which the spectral frequency of each pixel in the image reflects the direction of anisotropic water motion in the object.

2. Description of the Background Art

Magnetic resonance imaging (MRI) has proven to be one of the most versatile non-invasive imaging techniques in biomedicine capable of providing anatomical as well as functional information. Using appropriate motion encoding techniques, MRI can also provide images exhibiting quantitative information regarding motion of water molecules. While MRI dealing with macroscopic motion is generally referred to as flow imaging, MRI dealing with microscopic motion within a single voxel is referred to as diffusion weighted imaging.

The original Stejskal-Tanner sequence for measurement of molecular diffusion by nuclear magnetic resonance (NMR) employed diffusion gradient pulses (originally called time-dependent field gradient) to encode quantitative information regarding molecular motion (diffusion coefficient) into a signal intensity. The MRI sequence for diffusion weighted imaging (DWI) is an extension of this original Stejskal-Tanner sequence where differences in intravoxel water motion (a factor often referred to as apparent diffusion coefficient) are treated as another contrast mechanism.

Intravoxel anisotropic water motion produces signal attenuation of diffusion weighted images (DWIs) dependent on the direction of the diffusion gradient pulses applied. Such directional dependency, which is most conspicuous in the myelinated fibers of the nervous system, is thought to be due to anisotropic restriction of water diffusion. Therefore, DWIs obtained using diffusion gradient pulses applied to only one spatial axis are generally referred to as anisotropic DWIs, in contrast to conventional DWIs where diffusion gradient pulses are applied to three axial directions simultaneously.

Anisotropic DWIs contain information regarding intravoxel water motion in space projected onto the corresponding axis. While intravoxel isotropic water motion produces identical effects on signal intensity of anisotropic DWIs regardless of the direction of the diffusion gradient pulses, intravoxel anisotropic water motion affects signal intensity in a manner dependent on the angle of the direction of anisotropy with respect to the spatial axis in which the diffusion gradient pulses have been applied. Therefore, each anisotropic DWI can be considered the projection image of intravoxel anisotropic water motion. However, each pixel of anisotropic DWIs, the spatial information contained in which has three dimensional resolution, carries only one dimensional information regarding anisotropic water motion in space. As a result, image resolution is not as great as that where each pixel contains three dimensional information.

Therefore, there is a need for a method of reconstructing three dimensional information regarding intravoxel water motion from axial anisotropic DWI projection images of the identical imaging plane. The present invention satisfies that need, as well as others, and overcomes the deficiencies in conventional imaging methods.

SUMMARY OF THE INVENTION

The present invention comprises a method which will be referred to herein as "three dimensional anisotropy (3 DAC) contrast MRI". By way of example, and not of limitation, the first step in the method of the present is to obtain three single-axis anisotropic DWIs of the same imaging slice, where each axis is oriented in an orthogonal direction in relation to each other axis (x, y, z). Each such axial anisotropic DWI is obtained by applying the diffusion gradient pulse to only one of the corresponding spatial axes. Next, each axial anisotropic DWI is processed by a conventional two dimensional Fourier transform to produce corresponding gray-scaled images. Three primary colors, such as red, green, and blue, are then assigned to the gray scales of the three axial anisotropic DWIs, respectively, to produce corresponding color-scaled images. The three colored-scaled axial anisotropic DWI's are then combined pixel by pixel to form a single image in full visible color spectrum. The final image is then displayed negatively to obtain one to one correlation between red, green, blue and the x-, y-, z-axis, respectively, to produce a 3 DAC image in accordance with the present invention. Since the sum of the three primary colors of the same intensity results in cancellation (white out), the process effectively eliminates the background signals from isotropic water motion. Accordingly, each pixel of the 3 DAC image exhibits a color of a unique frequency, according to the balance of red, green, and blue, reflecting direction of anisotropic water motion in space.

Direction of anisotropic water motion can then be determined from the color of the pixels in the image, and relative density can be determined by the relative intensity of the color of the pixels in the image. For example, water motion in neuronal fibers, especially those in axons, possesses high intravoxel anisotropy compared to other elements of the nervous system. Therefore, the direction of the fibers corresponds to the direction of the anisotropic motion of the water molecules. Further, neuron density is proportional to fiber density, and fiber density is proportional to the intensity of the color of the pixels in the image. Therefore, the method of the present invention is especially sensitive for discerning axonal direction and density.

An object of the invention is to produce to images of the nervous system comparable to histological preparation.

Another object of the invention is to obtain images of with greater signal to noise ratios than conventional imaging techniques.

Another object of the invention is to remove imaging signals from isotropic motion of water molecules.

Another object of the invention is to obtain images with greater resolution than conventional imaging techniques.

Another object of the invention is to provide for localization of axonal abnormalities.

Another object of the invention is to provide for diagnosis of disease processes affecting specific neuronal tracts, such as amyotrophic lateral sclerosis, spino-cerebellar degeneration, toxic/metabolic axono/neuropathy, Wallerian degeneration, and diffuse axonal injury in closed head injury, to list a few.

Another object of the invention is to provide for indication of destructive diseases such as tumors, infectious diseases, or ischemic diseases by identifying disruption in the normal axonal pattern.

Another object of the invention is to provide for diagnosis of neuro-degenerative diseases such as Huntington's disease, Parkinson's disease, and Alzheimer's disease.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DESCRIPTION OF THE PREFERRED EMBODIMENTS

Figure 1:
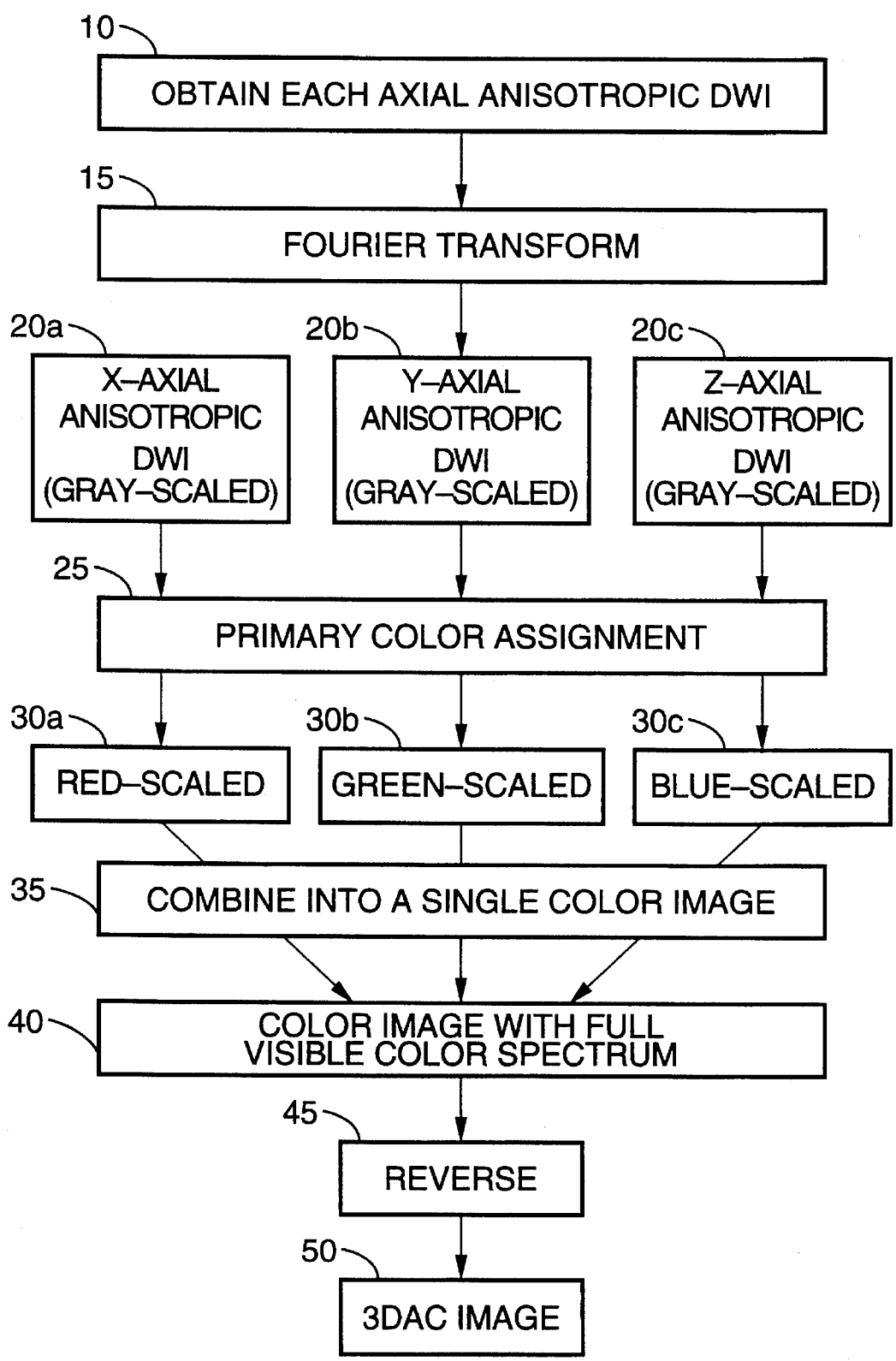
FIG. 1 is a flow diagram showing the method of the present invention.

Referring more specifically to the drawings, for illustrative purposes the present invention is embodied in the flow diagram generally shown in FIG. 1. It will be appreciated that the method may vary as to the particular steps and their sequence without departing from the basic concepts as disclosed herein.

Referring to FIG. 1, at step 10 three separate axial anisotropic DWIs of the identical imaging plane are obtained using a conventional magnetic resonance imaging system; that is, each image is obtained from the same slice. With reference to a Cartesian coordinate system commonly used in imaging, one image is obtained for each of x-, y- and z-axis, which are orthogonal to each other. Each image is obtained by applying the diffusion gradient pulse to only the corresponding spatial axis. For example, the x-axial anisotropic DWI is obtained by applying the diffusion gradient pulse to only the x-axis. Similarly, the y- and z-axial anisotropic DWI's are obtained by applying the diffusion gradient pulse to only the y- or z-axis, respectively. As a result, three images are obtained from diffusion gradient pulses applied in single orthogonal directions, as opposed to conventional MRI wherein the pulses are applied in all three directions simultaneously. Next, at step 15, the resulting images are processed by a conventional two dimensional Fourier transform thereby producing gray-scaled x-, y- and z-axial anisotropic DWIs at steps 20a, b, c, respectively. Then, at step 25, three primary colors, red, green, and blue, are assigned to the gray scale of the three axial (x-, y-, z-axis), anisotropic DWIs, respectively, and colored using conventional techniques. Thus, the gray-scaled images become red-, green- and blue-scaled at steps 30a, b, c, respectively. At step 35, these three primary color images are then vectorially combined pixel by pixel to form a single image in full visible color spectrum at step 40. Since the sum of the three primary colors of the same intensity results in cancellation (white out), the process effectively eliminates the background signals from isotropic water motion. Accordingly, each pixel of the final color image exhibits a color of a unique frequency, according to the balance of red, green, and blue, reflecting direction of anisotropic water motion in space. At step 45, the final image is then displayed negatively to obtain one to one correlation between the primary colors (red, green, blue) and the spatial axes (x-, y- and z-axis). The 3 DAC image is then available at step 50 for evaluation. From the 3 DAC image, direction of anisotropic motion of water molecules is determined relative to the three orthogonal directions and the primary colors. In addition, density of the object will be proportional to the intensity of the colors, with a more intense color indicating a higher density.

Figure 2:
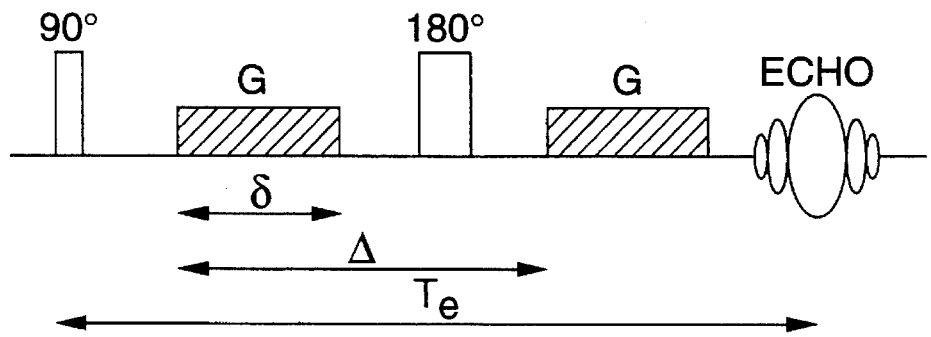
FIG. 2 is a diagrammatic representation of a typical Stejskal-Tanner pulse sequence used in nuclear magnetic resonance imaging.
Figure 3:
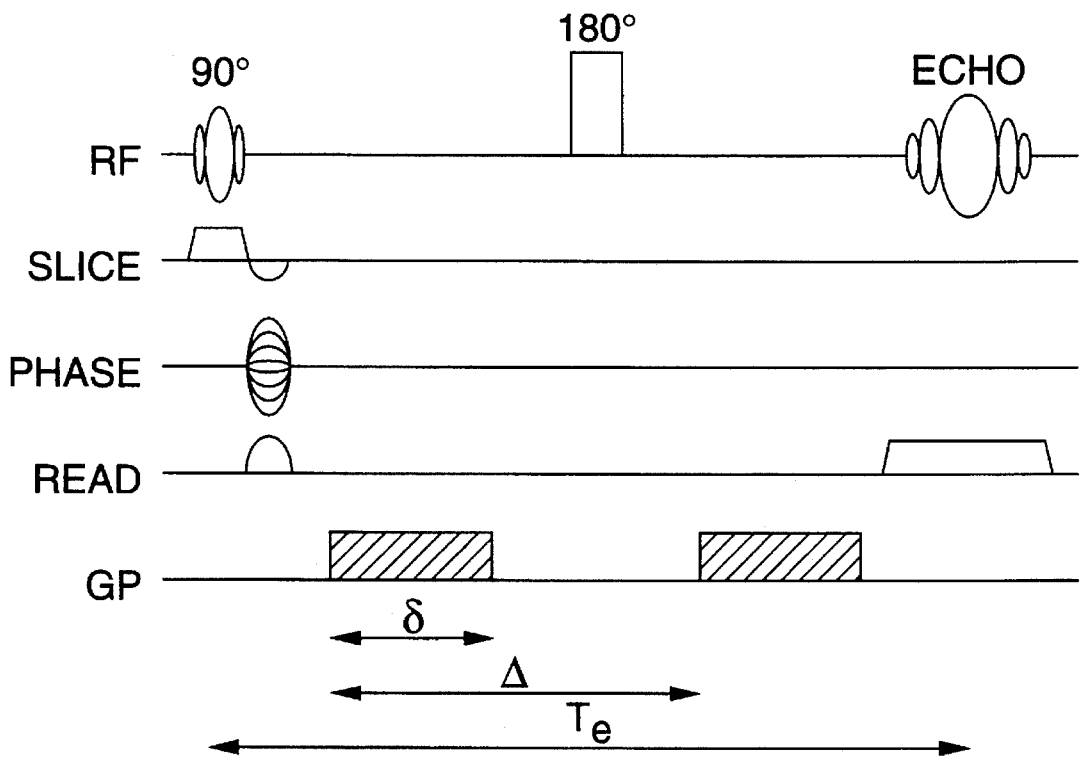
FIG. 3 is a diagrammatic representation of a modified Stejskal-Tanner pulse sequence for diffusion weighted imaging in accordance with the method of the present invention.

FIG. 2 shows an example of the original Stejskal-Tanner sequence for measurement of molecular diffusion by nuclear magnetic resonance employs diffusion gradient pulses to encode quantitative information regarding molecular motion into a signal intensity. FIG. 3 shows a typical magnetic resonance imaging sequence for DWIs used in the method of the present invention which, as can be seen, is an extension of the original Stejskal-Tanner sequence. Differences in intravoxel water motion are treated as another contrast mechanism.

Using the modified Stejskal and Tanner DWI sequence shown in FIG. 2, signal intensity (I) of each pixel in the presence of gradient pulses can be expressed as:

$$\vec{I} = I_0 \cdot \left(1 - 2\exp\left[-\frac{(T_r - T_e/2)}{T_1}\right] + \exp\left[-\frac{T_r}{T_1}\right]\right) \cdot$$
$$\exp\left[-\frac{T_e}{T_2}\right] \cdot \exp\left[-\gamma^2 \vec{G}^2 \vec{D} \delta^2 \left(\Delta - \frac{\delta}{3}\right)\right]$$

where $I_0$=the initial intensity, Tr=repetition time, Te=echo time, $T_1$=longitudinal relaxation time, $T_2$=spin-spin relaxation time, γ=nuclear gyromagnetic ratio, D=diffusion coefficient, G=gradient intensity, δ=pulse duration and Δ=interval between the gradient pulses. In in vivo imaging studies, D is replaced by the apparent diffusion coefficient, $D_{app}$, which, in addition to pure water diffusion (incoherent motion), includes other factors representing intravoxel micromotion of water molecules (coherent motion) such as axoplasmic flow. Parameters which possess directional dependency are indicated by vector notation. Because of the necessity for rather long diffusion gradient pulses, heavily diffusion weighted images are in principle also heavily $T_2$ weighted. Using D (or $D_{app}$), the average distance traveled by water molecules (diffusion length) during a given time (diffusion time) can be calculated as the mean square of Gaussian at time t. Accordingly, diffusion length is given as $\sqrt{2D\tau}$ (one dimension), where τ is the diffusion time defined in the Stejskal-Tanner sequence as $$\Delta - \frac{\delta}{3}.$$

In the preferred embodiment, the vector sum of $\vec{D}(x,y,z)$ with respect to Cartesian space (x, y, z) is obtained utilizing characteristics of the color spectrum of visible light and expressed in color-coded contrast of I (intensity, color). Neuronal fibers, especially myelinated axons exhibit significant directional dependency in apparent diffusion coefficients, being much higher in the longitudinal direction compared to the axial direction. Therefore, the present invention provides sensitive MRI contrast for axonal information displaying qualitative information (direction) by spectral frequency (color) and quantitative information (relative density) by the intensity of each color, simultaneously, within the same pixel.

There are two factors likely to account for the directional dependency of apparent diffusion coefficients in axons and dendrites, namely, restricted diffusion and axoplasmic flow. It is generally agreed that free unrestricted water diffusion at 37° C. is $3-4\times10^{-5}$ cm$^2$/sec. Using the typical diffusion time utilized in DWI, diffusion length (one dimensional) can be estimated to be in the range of 12–18 μm. Since the size of neuronal and glial cell bodies ranges between 6–80 μm, and the diameter of axons and dendrites is 2–10 μm, it is natural to consider that water diffusion in certain structure may indeed be subject to severe restriction in the axial direction. Axons have the highest anisotropy among nervous system elements and have virtually no restriction in the longitudinal direction. Recent studies on human brain, however, indicated that water may diffuse with a measurable rate across myelin and, therefore, restricted diffusion may not be a primary factor determining the observed anisotropic behavior of apparent diffusion coefficients of myelinated fibers.

Normal axonal transport is an energy dependent active substrate transport system between cell bodies and nerve terminals. Organelles transported in this system are known to move at a rate in excess of 400 mm/day. All axonal transport of substrates is accompanied by coherent movements of cytosolic water molecules known as axoplasmic flow. This microscopic flow of water molecules in axons may represent intravoxel anisotropic motion primarily responsible for the directional dependency of apparent diffusion coefficients in axons.

EXAMPLE 1

Axonography of the Spinal Cord

Sprague-Dawley rats were anesthetized with intraperitoneal pentobarbital, 50 mg/kg. The body temperature of the animals was maintained at 37° C. by applying a non-magnetic heating pad. AGE Omega 7T system equipped with a self-shielding gradient coil (Nalorac Cryogenics, Mart inez, Calif.) was used. The radio frequency coil was a three inch (i.d.) birdcage coil. A 50 mm×50 mm field of view was observed using a 256×256 matrix of data points providing ca. 195 μm×195 m spatial resolution. Images were obtained at 300.49 MHz with a slice thickness of 3 mm. Raw data was obtained using 128 phase encoding steps (sum of 8 scans for $T_1$ weighted image and 4 scans for the remaining images) and zero-filled into 256 data points. The acquisition parameters for $T_1$ and $T_2$ weighted images were: Tr=400 msec, Te=18 msec for $T_1$, and Tr=2 sec, Te=80 msec for $T_2$, respectively. The acquisition parameters for each diffusion weighted image were: Tr=2 sec, Te=80 msec, G=3.2 gauss/cm, δ=15 msec, Δ=40 msec.

$T_1$ and $T_2$ weighted images, X-, Y-, and Z-axis anisotropic DWIs, and 3 DAC image of the rat at the level of the cervical spine were compared. It was found that, in the 3 DAC image in accordance with the present invention, there was remarkable resolution of the anatomy of the rat spinal cord which is merely 4 mm, maximum, in diameter. Color-coded directional information regarding anisotropic motion corresponds highly to the direction of the fiber tracts. The long tract fibers in the posterior column as well as within the ventral and lateral funiculus could be easily identified. Upon exit from the spinal cord, the ventral and dorsal root fibers curved around the cord and the directional change was accordingly reflected in color changes. Contrast among the layers of Rexed of the gray matter was seen as intensity differences in similar color frequencies. Layers 5 and 6 which had the least fiber density were the most isochromatic and least intense, while the color intensity of layers 1–4 and 7 indicated a higher density of fibers in the vertical (Y-axis) direction.

EXAMPLE 2

Nervous System Imaging

Sprague-Dawley rats were anesthetized with intraperitoneal pentobarbital, 50 mg/kg, and placed in a specially designed holder with a plastic fixation device for the head to ensure identical slices at each imaging session. The body temperature of the animals was maintained at 37° C. by applying a non-magnetic heating pad. AGE Omega 7T system equipped with a self-shielding gradient coil (Nalorac Cryogenics, Martinez, Calif.) was used. The radio frequency coil was a three inch (i.d.) bird-cage coil. A 50 mm×50 mm field of view was observed using a 256×256 matrix of data points providing ca. 195 μm×195 μm spatial resolution. Images were obtained at 300.49 MHz with a slice thickness of 2 mm. Raw data were obtained using 128 phase encoding steps (sum of 4 scans) and zero-filled into 256 data points. A total of three anisotropic DWIs for each the axes of the identical volume, was obtained with acquisition parameters of: Tr=2 sec, Te=80 msec, G=3.2 gauss/cm, δ=15 msec, Δ=40 msec. The total time needed for a single DWI was ca. 17 minutes.

Representative three axial anisotropic DWIs (in gray scale), $T_1$ (Tr=400 ms, Te=18 ms) and $T_2$ weighted (Tr=2 sec, Te=80 ms) images, and a 3 DAC image of the rat brain were compared. In the 3DAC image constructed in accordance with the present invention, the oculomotor (3rd), trochlear (4th), and trigeminal (5th) nerves were clearly visualized. The color frequency provided directional information. The ophthalmic division of the trigeminal nerve, which is the dominant branch of the trigeminal nerve in rats and runs perpendicular to the slice, exhibited a blue-dominant (Z-direction) color, whereas the mandibular division, which turns laterally at this level, showed a red-dominant (X-direction) color. The color of the oculomotor and trochlear nerves which run obliquely in this slice indicated a ca. 45 degree angle on the X–Y plane.

Contrast in the cortex was seen as intensity variation between colors of similar frequencies and reflected differences in fiber density. Layer I, which had a structure similar to the molecular layer of human cerebellum and consisted primarily of short tract neuronal fibers, exhibited a higher intensity than layers II–IV, which consisted primarily of cell bodies. Layers V–VI, which contain a higher number of long-tract fibers, again exhibited a high intensity. The diencephalic and medial temporal areas contained a high neuronal density and exhibited a strong isochromatic component (gray). Various long tracts within these areas (i.e. pyramidal tract) showed a blue-dominant (Z-direction) color reflecting their direction.

As can be seen, therefore, 3 DAC MRI possesses significant potential for various biological and clinical applications. Clinical implementation of the 3 DAC MRI technique is imminently feasible. The total time needed for data acquisition necessary for 3 DAC image construction (three anisotropic DWIs) in our study was less than 52 minutes. The method calls for the addition (not subtraction) of three DWIs, providing $\sqrt{3}$ times greater signal to noise ratio (S/N) of a single diffusion weighted image while unwanted isotropic components (background) are subtracted out. The gradient strength utilized in this examples give above was 3.2 gauss/cm, a strength considerably lower than that necessary for equivalent MRI microscopy. Gradient coils with strength in the range between 3–4 gauss/cm have already been available for human head MRI systems designed for echo planar imaging. It is likely, therefore, that with minor modification, 3 DAC MRI can be performed using conventional 1.5T clinical imagers.

Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. A method for contrast imaging anisotropic motion of water molecules in an object, comprising the steps of:
    (a) obtaining a plurality of gray-scaled diffusion weighted images of an identical slice of an object using magnetic resonance imaging, each said image being obtained by applying a diffusion gradient pulse in a single direction along a corresponding axis, each said axis being orthogonal in relation to each other axis;
    (b) color scaling each said gray-scaled diffusion weighted image with a different primary color; and
    (c) combining each said color-scaled diffusion weighted image to produce a single image.

2. A method as recited in claim 1, further comprising the step of determining direction of anisotropic motion of water molecules in said object from variations in spectral frequency of colors within said single image, said direction of anisotropic motion being determined relative to said axes and said primary colors.

3. A method as recited in claim 2, further comprising the step of determining direction of fibers in fibrous tissue contained within said object, said direction of fibers corresponding to said direction of anisotropic motion of water molecules in said object.

4. A method as recited in claim 1, further comprising the step of determining relative density of portions of said object from variations in intensity of color within said single image, said density being proportional to said intensity of color.

5. A method as recited in claim 1, further comprising the step of determining relative density of neurons in portions of said object, said neuron density being proportional to density of fibers in fibrous tissue contained within said object, said density of fibers being proportional to intensity of color within said single image.

6. A method as recited in claim 1, wherein a substantially white color within said single image indicates isotropic motion of water molecules in the object, and wherein a substantially non-white color within said single image indicates anisotropic motion of water molecules in the object.

7. A method for contrast imaging anisotropic motion of water molecules in an object in a body using magnetic resonance imaging, comprising the steps of:
    (a) obtaining three gray-scaled diffusion weighted images of an identical slice of an object from a magnetic resonance imaging system, each said image being obtained by applying a corresponding diffusion gradient pulse in a corresponding one of a plurality of orthogonal directions;
    (b) color-scaling, in corresponding ones of three respective primary colors, each said diffusion weighted image according to said gray-scaling; and
    (c) combining the three color-scaled diffusion weighted images into a single image.

8. A method as recited in claim 7, further comprising the steps of defining a substantially white color within said single image as representing isotropic motion of water molecules in the object, and defining a substantially non-white color within said single image as representing anisotropic motion of water molecules in the object.

9. A method as recited in claim 8, further comprising the step of determining direction of said anisotropic motion from variations in spectral frequency of said non-white color, said direction of anisotropic motion being determined relative to said three orthogonal directions and said colors.

10. A method as recited in claim 9, further comprising the step of determining direction of fibers in fibrous tissue contained within said object, said direction of fibers corresponding to said direction of anisotropic motion of water molecules in said object.

11. A method as recited in claim 7, further comprising the step of determining relative density of portions of said object from variations in intensity of color within said single image, said density being proportional to said intensity of color.

12. A method as recited in claim 7, further comprising the step of determining relative density of neurons in portions of said object, said neuron density being proportional to density of fibers in fibrous tissue contained within said object, said density of fibers being proportional to intensity of color within said single image.

13. A method for imaging anisotropic motion of water molecules in an object, comprising the steps of:
    (a) obtaining three gray-scaled diffusion weighted images of an identical slice of an object from a magnetic resonance imaging system, each said image being obtained by applying a corresponding diffusion gradient pulse in a corresponding one of a plurality of orthogonal directions, each said diffusion weighted image corresponding to both isotropic and anisotropic motion of water molecules in the object;
    (b) color-scaling, in a corresponding one of three respective colors, the diffusion weighted image for each of the three respective orthogonal directions; and
    (c) combining the color-scaled diffusion weighted images into a single image, wherein the three respective colors combine to form a substantially white color to represent isotropic motion of water molecules in the object, and wherein the three respective colors combine to form a substantially non-white color to represent anisotropic motion of water molecules in the object.

14. A method as recited in claim 13, further comprising the step of determining direction of said anisotropic motion from variations in spectral frequency of said non-white color, said direction of anisotropic motion being determined relative to said three orthogonal directions and said colors.

15. A method as recited in claim 14, further comprising the step of determining direction of fibers in fibrous tissue contained within said object, said direction of fibers corresponding to said direction of anisotropic motion of water molecules in said object.

16. A method as recited in claim 13, further comprising the step of determining relative density of portions of said object from variations in intensity of color within said single image, said density being proportional to said intensity of color.

17. A method as recited in claim 13, further comprising the step of determining relative density of neurons in portions of said object, said neuron density being proportional to density of fibers in fibrous tissue contained within said object, said density of fibers being proportional to intensity of color within said single image.

18. A method for anisotropic contrast imaging, comprising the steps of:
   (a) obtaining a first gray-scaled image of an object from magnetic resonance imaging using a diffusion gradient pulse applied in a first direction;
   (b) obtaining a second gray-scaled image of an object from magnetic resonance imaging using a diffusion gradient pulse applied in a second direction orthogonal to said first direction;
   (c) obtaining a third gray-scaled image of an object from magnetic resonance imaging using a diffusion gradient pulse applied in a third direction orthogonal to said first and second directions;
   (d) color-scaling said first image with a first primary color;
   (e) color-scaling said second image with a second primary color;
   (f) color-scaling said third image with a third primary color; and
   (g) combining said first, second and third colored images to form a fourth image.

19. A method as recited in claim 18, further comprising the step of negatively displaying said fourth image to obtain one to one correlation between said primary colors and said orthogonal directions.

20. A method as recited in claim 19, further comprising the step of determining direction of anisotropic motion of water molecules in said object from variations in spectral frequency of colors within said negatively displayed fourth image, said direction of anisotropic motion being determined relative to said three orthogonal directions and said primary colors.

21. A method as recited in claim 20, further comprising the step of determining direction of fibers in fibrous tissue contained within said object, said direction of fibers corresponding to said direction of anisotropic motion of water molecules in said object.

22. A method as recited in claim 19, further comprising the step of determining relative density of portions of said object from variations in intensity of color within said negatively displayed fourth image, said density being proportional to said intensity of color.

23. A method as recited in claim 19, further comprising the step of determining relative density of neurons in portions of said object, said neuron density being proportional to density of fibers in fibrous tissue contained within said object, said density of fibers being proportional to intensity of color within said negatively displayed fourth image.

24. A method as recited in claim 19, wherein a substantially white color within said negatively displayed fourth image indicates isotropic motion of water molecules in the object, and wherein a substantially non-white color within said negatively displayed fourth image indicates anisotropic motion of water molecules in the object.

25. A method for constructing an image of anisotropic motion of water molecules in an object using magnetic resonance imaging, comprising the steps of:
   (a) obtaining a plurality of axial diffusion weighted images of an identical slice of an object using magnetic resonance imaging, each of said images being obtained by applying a diffusion gradient pulse in a corresponding one of a plurality of orthogonal directions;
   (b) coloring each of said images with a separate primary color;
   (c) combining each of said colored images to form a single colored image; and
   (d) determining direction of anisotropic motion of water molecules in said object according to variations in color within said single image, said direction of anisotropic motion being determined relative to said three orthogonal directions and said primary colors.

26. A method as recited in claim 25, further comprising the step of determining direction of fibers in fibrous tissue contained within said object, said direction of fibers corresponding to said direction of anisotropic motion of water molecules in said object.

27. A method as recited in claim 25, further comprising the step of determining relative density of portions of said object from variations in intensity of color within said single image, said density being proportional to said intensity of color.

28. A method as recited in claim 25, further comprising the step of determining relative density of neurons in portions of said object, said neuron density being proportional to density of fibers in fibrous tissue contained within said object, said density of fibers being proportional to intensity of color within said single image.

29. A method as recited in claim 25, wherein a substantially white color within said single image indicates isotropic motion of water molecules in the object, and wherein a substantially non-white color within said single image indicates anisotropic motion of water molecules in the object.

* * * * *